United States Patent
Lee et al.

(10) Patent No.: US 12,490,644 B2
(45) Date of Patent: Dec. 2, 2025

(54) SOLAR CELL UPPER ELECTRODE AND MANUFACTURING METHOD THEREFOR

(71) Applicant: GWANGJU INSTITUTE OF SCIENCE AND TECHNOLOGY, Gwangju (KR)

(72) Inventors: Kwang Hee Lee, Gwangju (KR); Hong Kyu Kang, Gwangju (KR); Soo Young Jang, Gwangju (KR); Seok Kim, Gwangju (KR); Hyun Min Park, Gwangju (KR); Jong Hoon Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 18/649,202

(22) Filed: Apr. 29, 2024

(65) Prior Publication Data
US 2024/0304737 A1    Sep. 12, 2024

Related U.S. Application Data

(62) Division of application No. 17/793,334, filed as application No. PCT/KR2021/005673 on May 6, 2021, now abandoned.

(30) Foreign Application Priority Data

May 6, 2020  (KR) .................... 10-2020-0053986

(51) Int. Cl.
  *H10K 85/10*  (2023.01)
  *H10K 30/82*  (2023.01)

(52) U.S. Cl.
  CPC ......... *H10K 85/1135* (2023.02); *H10K 30/82* (2023.02)

(58) Field of Classification Search
  None
  See application file for complete search history.

(56) References Cited

FOREIGN PATENT DOCUMENTS

| JP | 2006202760 | 8/2006 |
| KR | 101006078 | 1/2011 |

(Continued)

OTHER PUBLICATIONS

Saxena et al., ACS Appl. Mater. Interfaces, 2019, 11, 8060-8071. (Year: 2019).*

(Continued)

*Primary Examiner* — Eli S Mekhlin
(74) *Attorney, Agent, or Firm* — Brooks, Cameron & Huebsch, PLLC

(57) ABSTRACT

Provided in one embodiment of the present invention is a solar cell upper electrode which is positioned on a photoactive layer and which includes a conductive polymer layer, wherein ionic liquid comes in contact with the surface of the conductive polymer layer so as to the post-treated, and, due to the post-treatment, an ion-exchange reaction occurs only in the upper area of the conductive upper electrode according to an embodiment of the present invention is not gelated so as to improve electrode performance, and does not oxidize a photoactive layer positioned under the electrode so as to be usable as an upper electrode, and thus can improve the performance of a solar cell to which the electrode is applied.

6 Claims, 12 Drawing Sheets

(56) References Cited

FOREIGN PATENT DOCUMENTS

KR          101075485        10/2011
KR        20190071489         6/2019
WO         2015089001         6/2015

OTHER PUBLICATIONS

International Search Report and Written Opinion from related PCT Application No. PCT/KR2021/005673, dated Aug. 26, 2021, 5 pages.
Li et al, Optical properties and conductivity of PE DOT PSS films treated by polyethylenimine solution for organic solar cells, 2015, Organic Electronics, vol. 21, p. 144-148.
Bad re et al, Highly Conductive Poly(3,4-ethylenedioxythiophene): Poly(styrenesulfonate) Films Using 1-Ethyl-3-methylimidazolium Tetracyanoborate Ionic Liquid, 2012, Advanced Functional Matter, vol. 22, pp. 2723-2727.

\* cited by examiner

[FIG. 1]
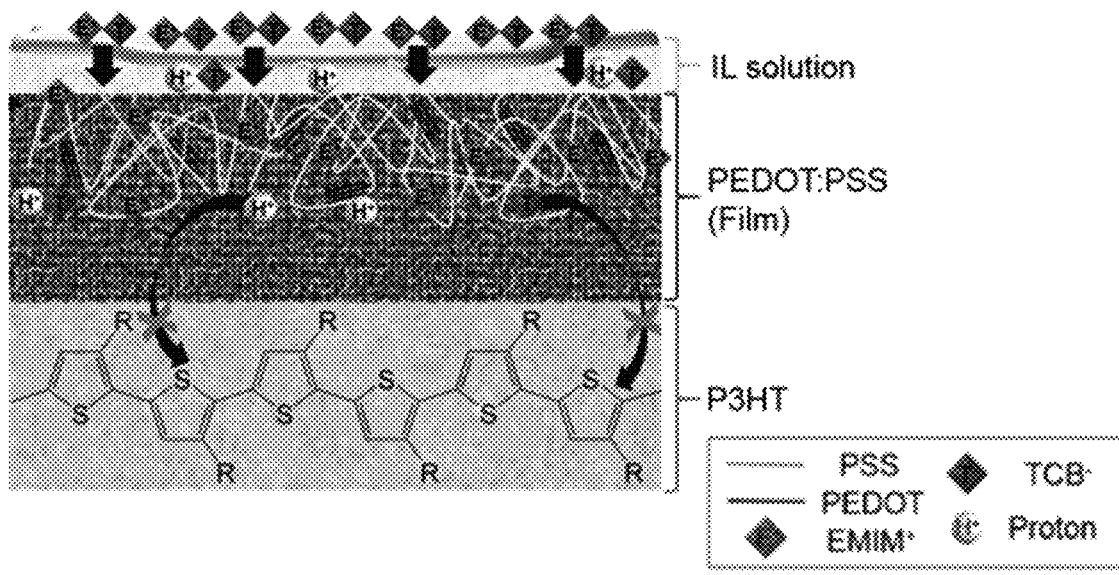

[FIG. 2]
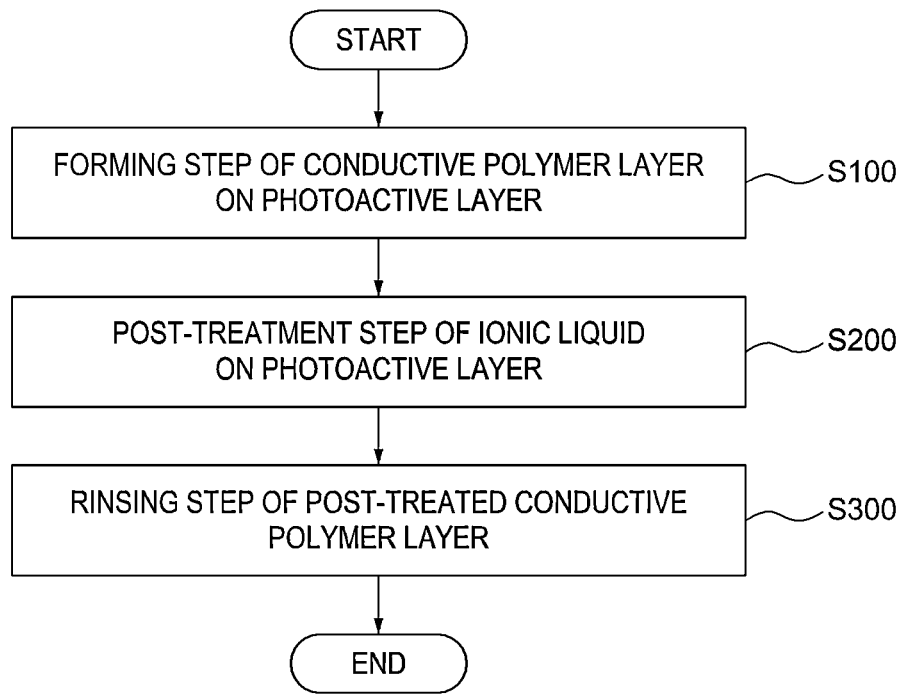

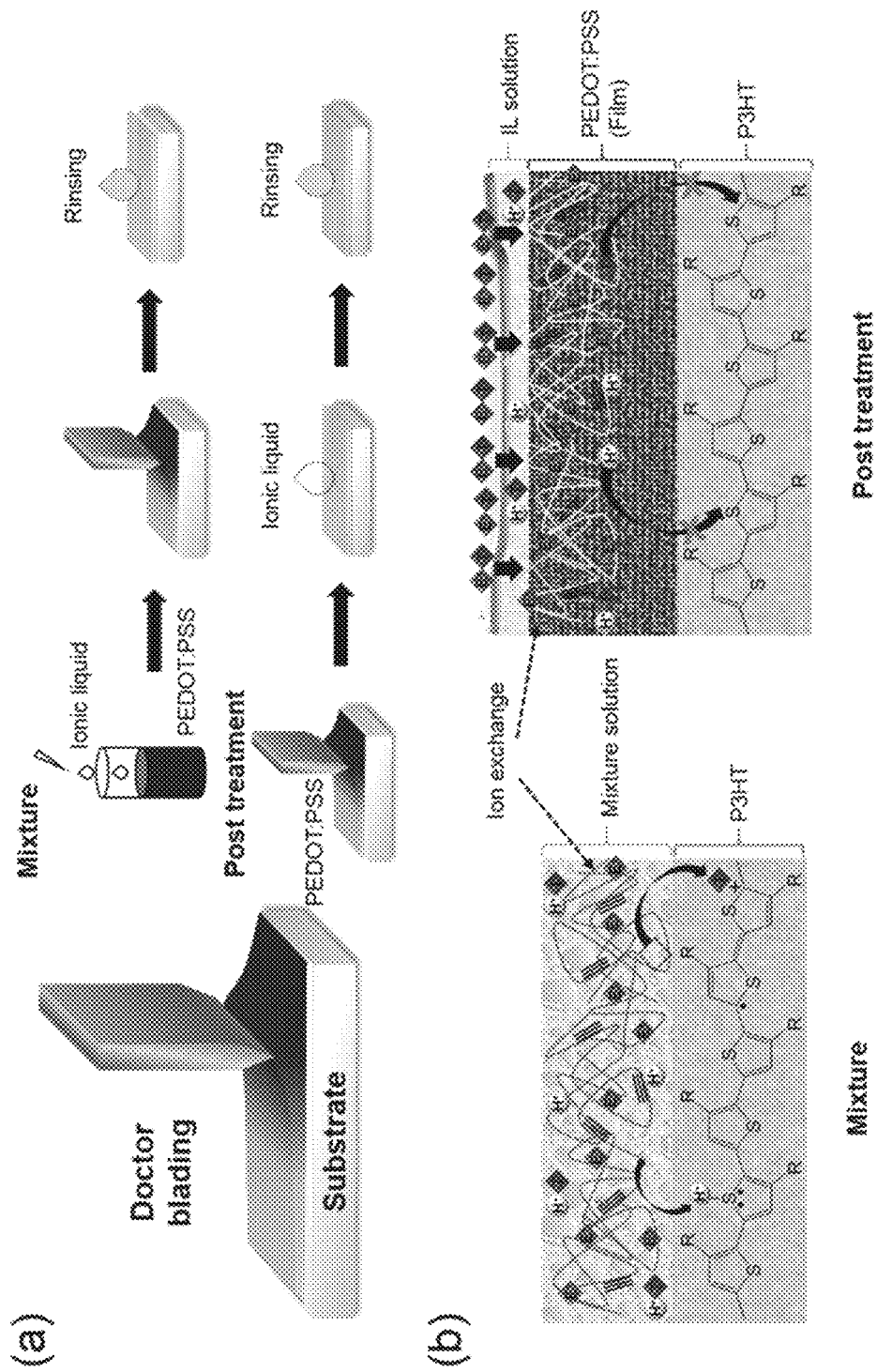
[FIG. 3]

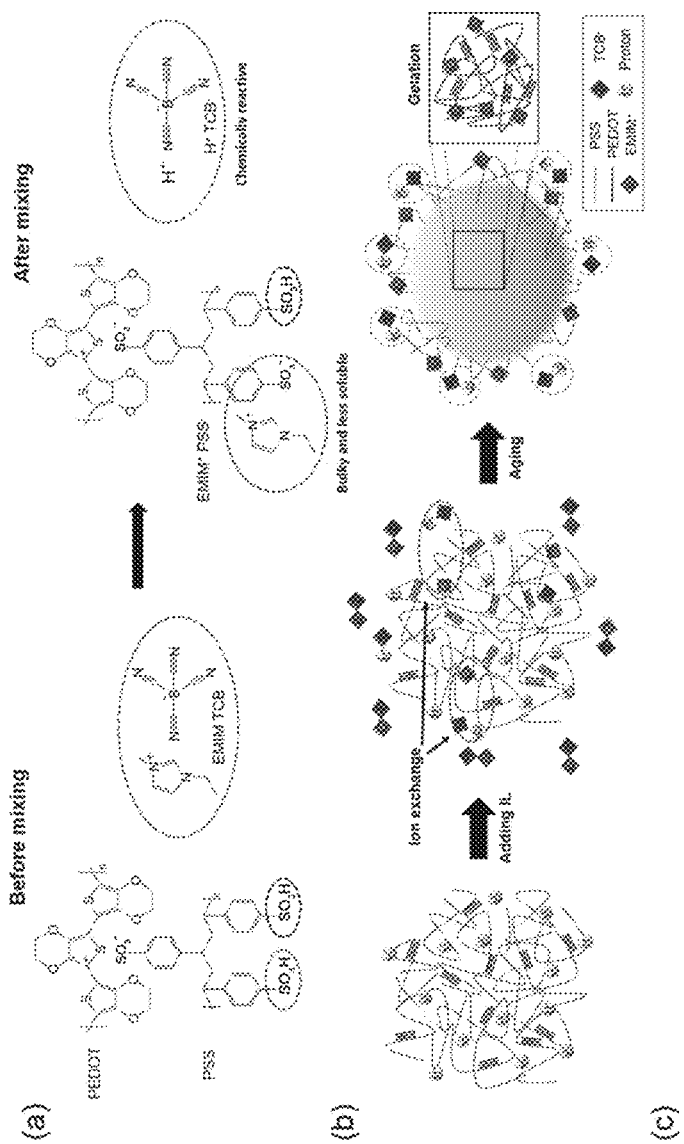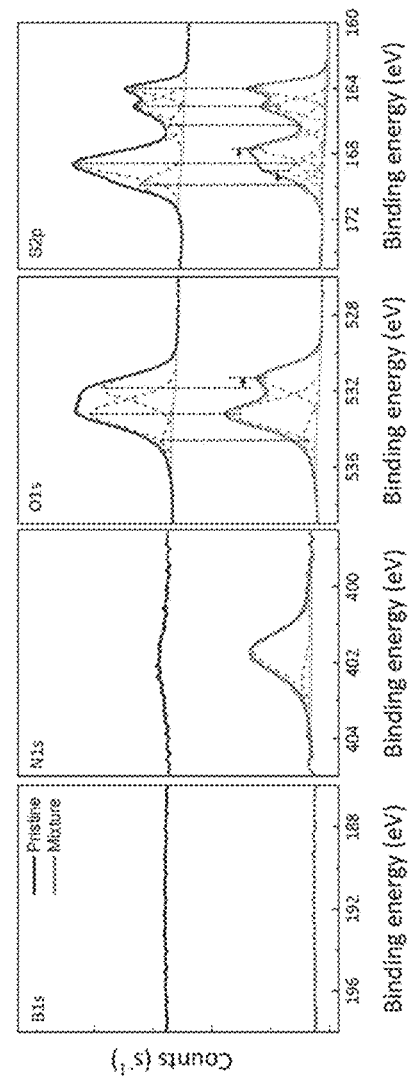
[FIG. 4]

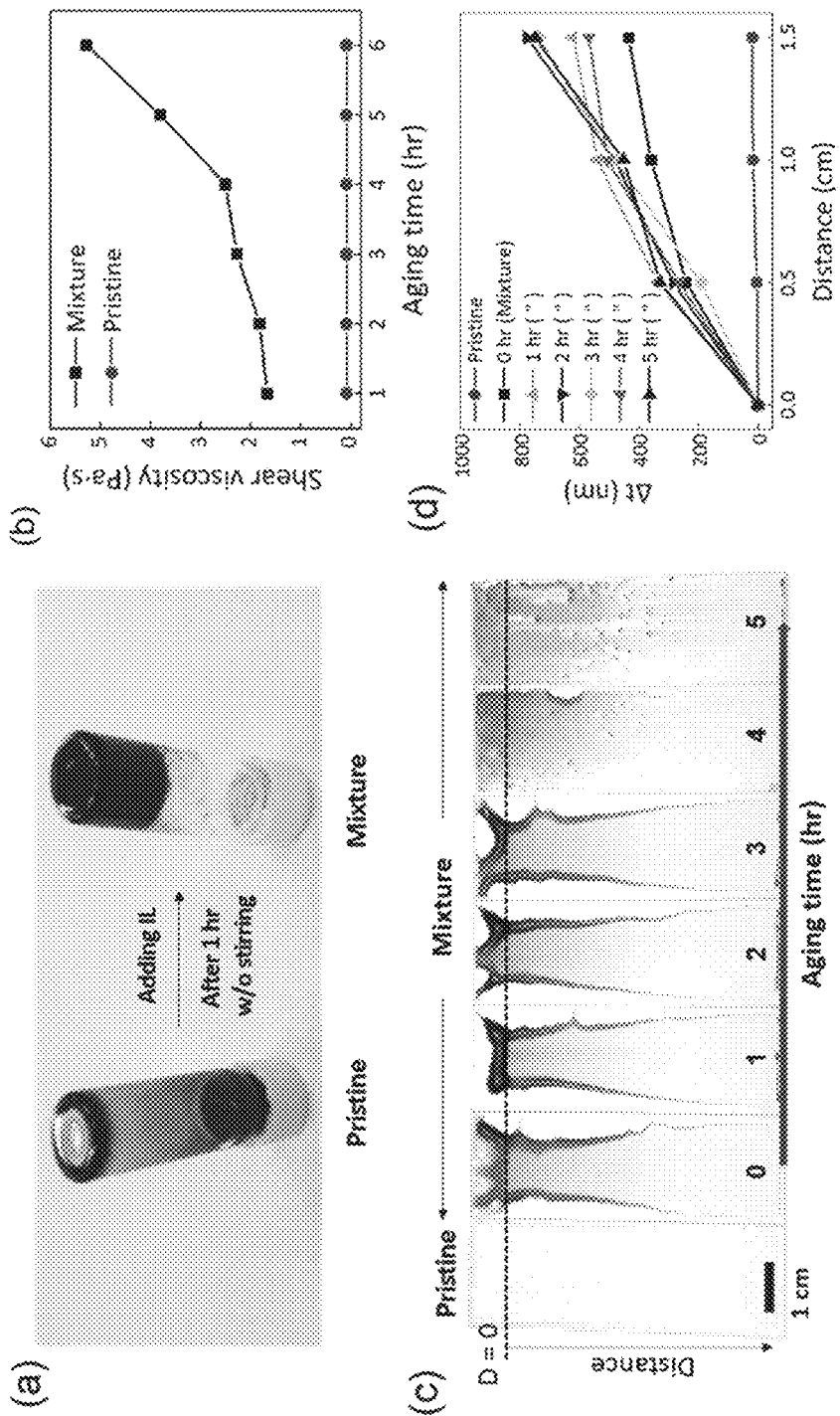
[FIG. 5]

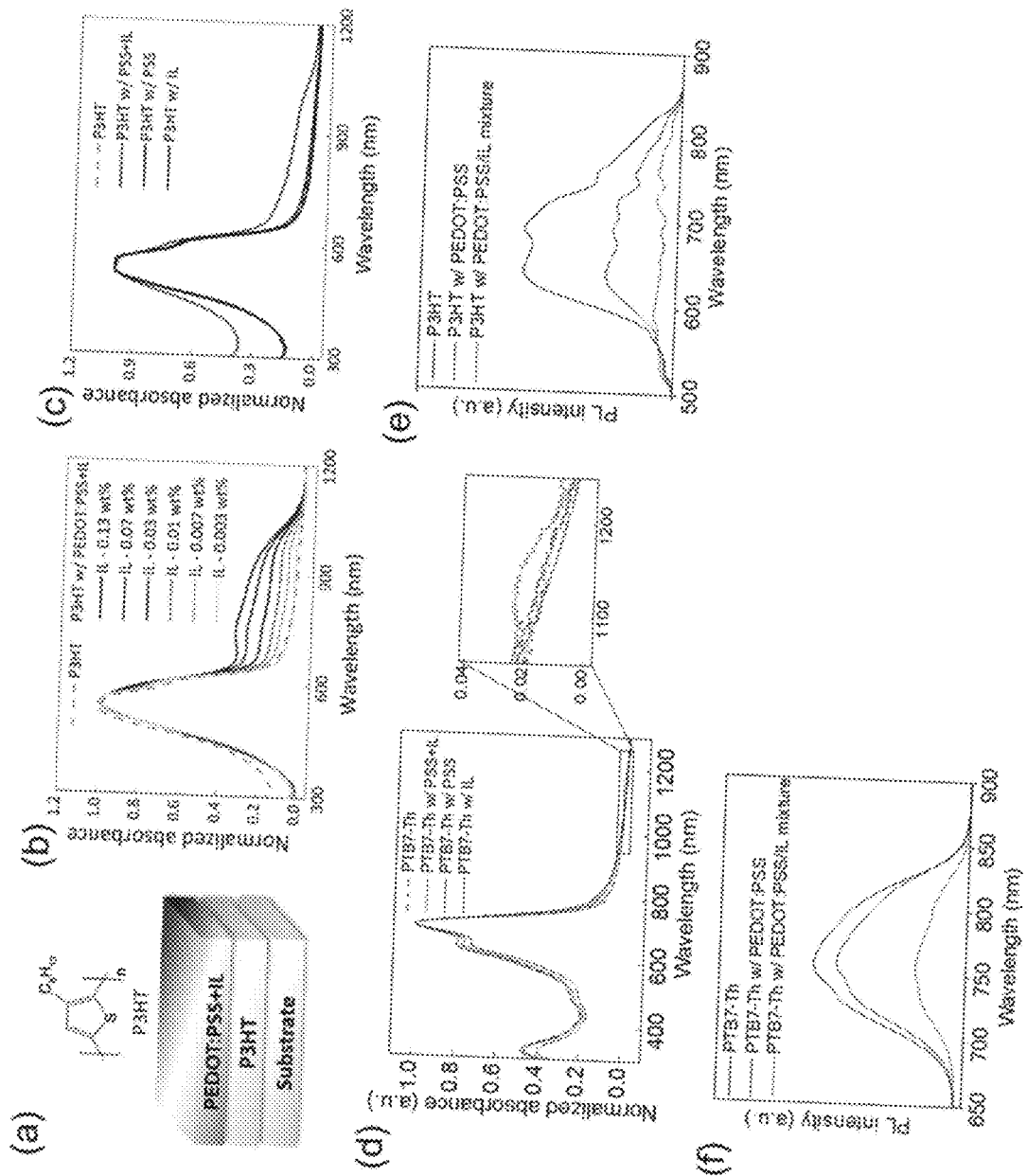
[FIG. 6]

[FIG. 7]
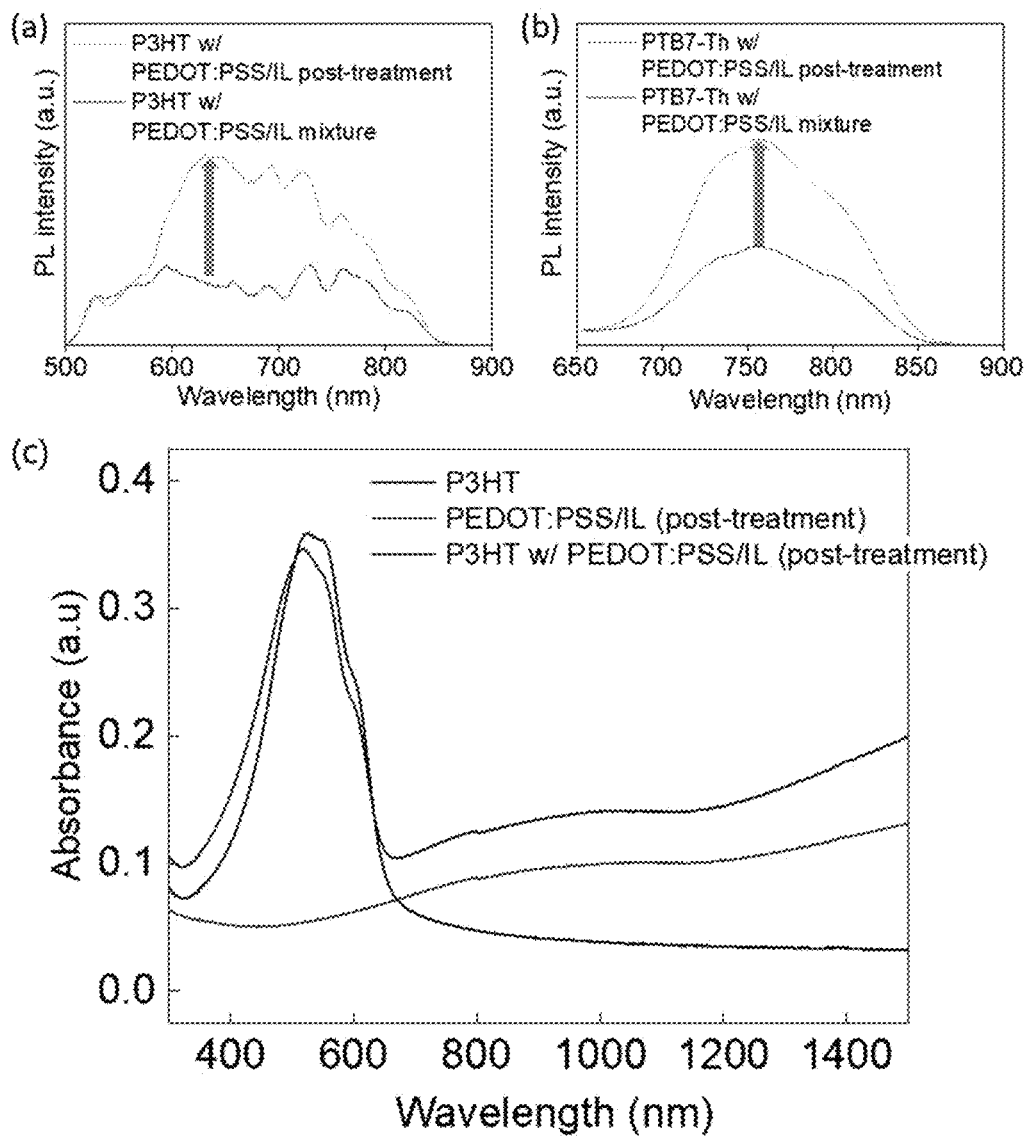

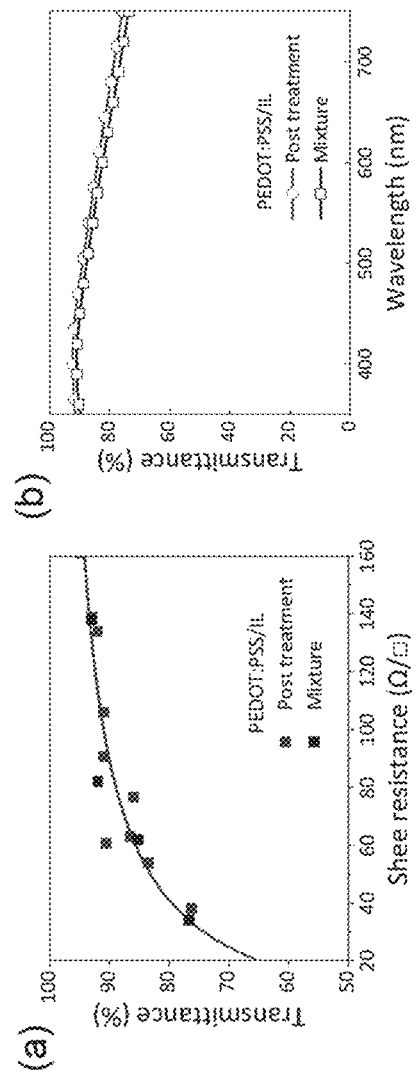
[FIG. 8]

[FIG. 9]
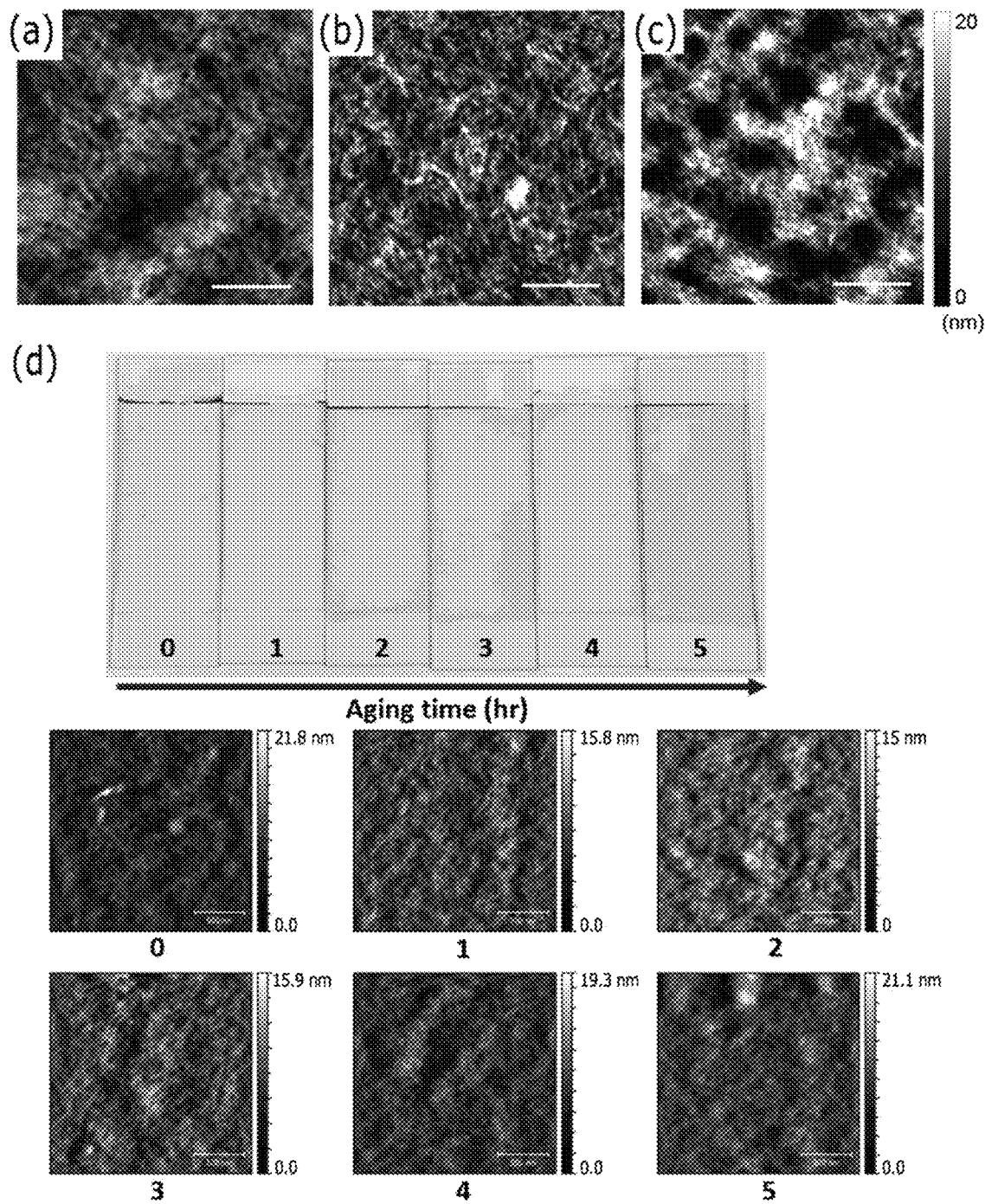

[FIG. 10]
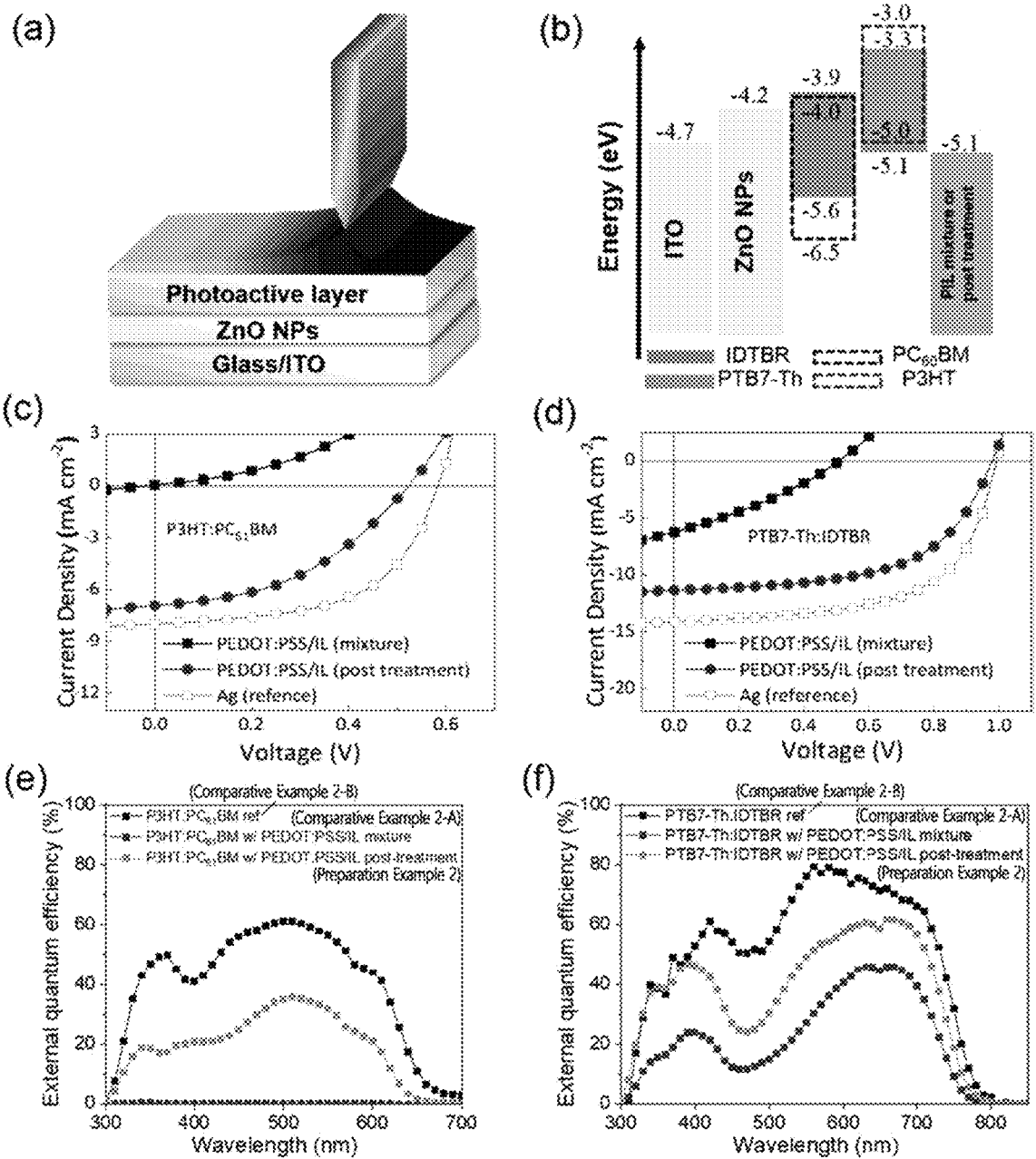

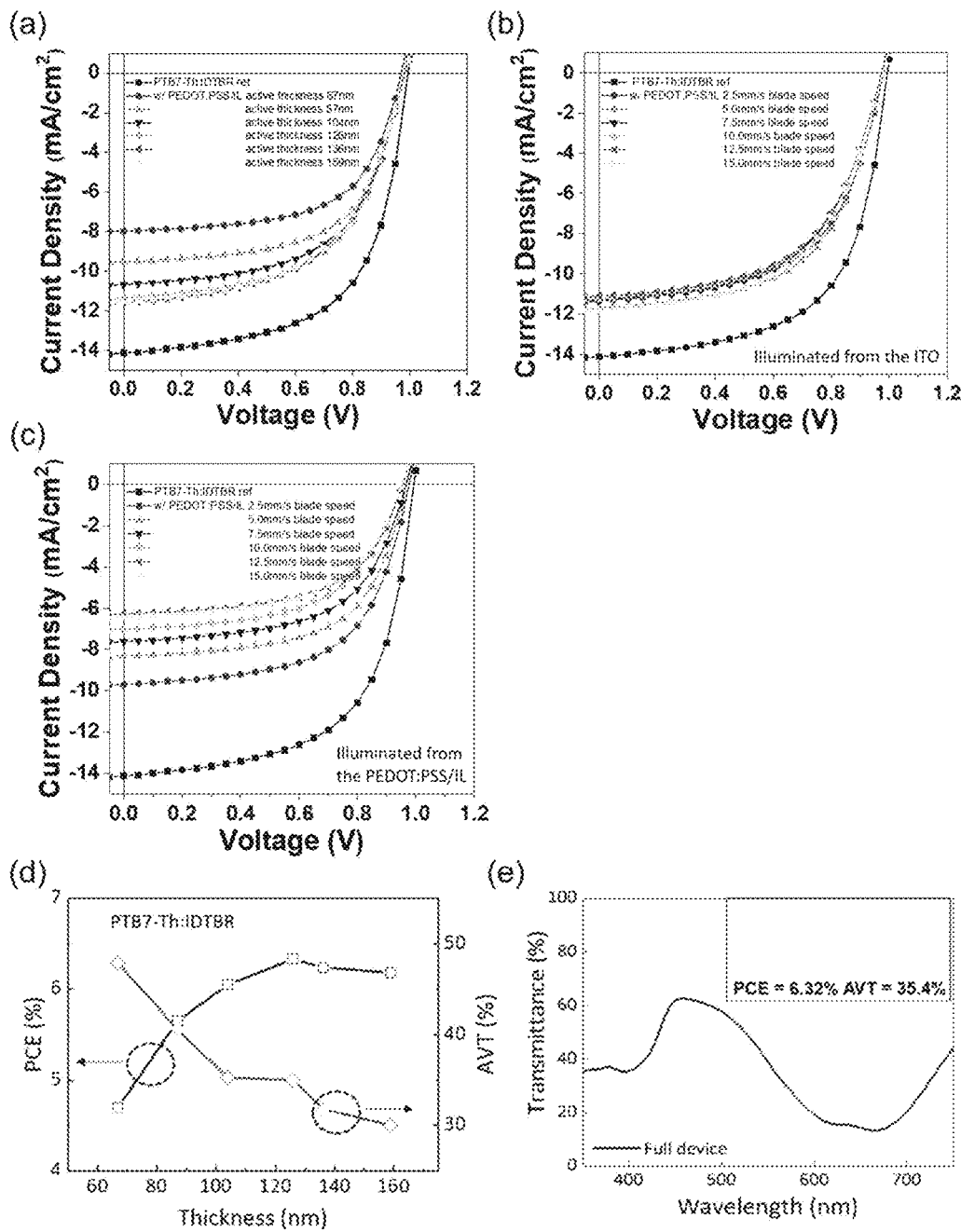
[FIG. 11]

[FIG. 12]
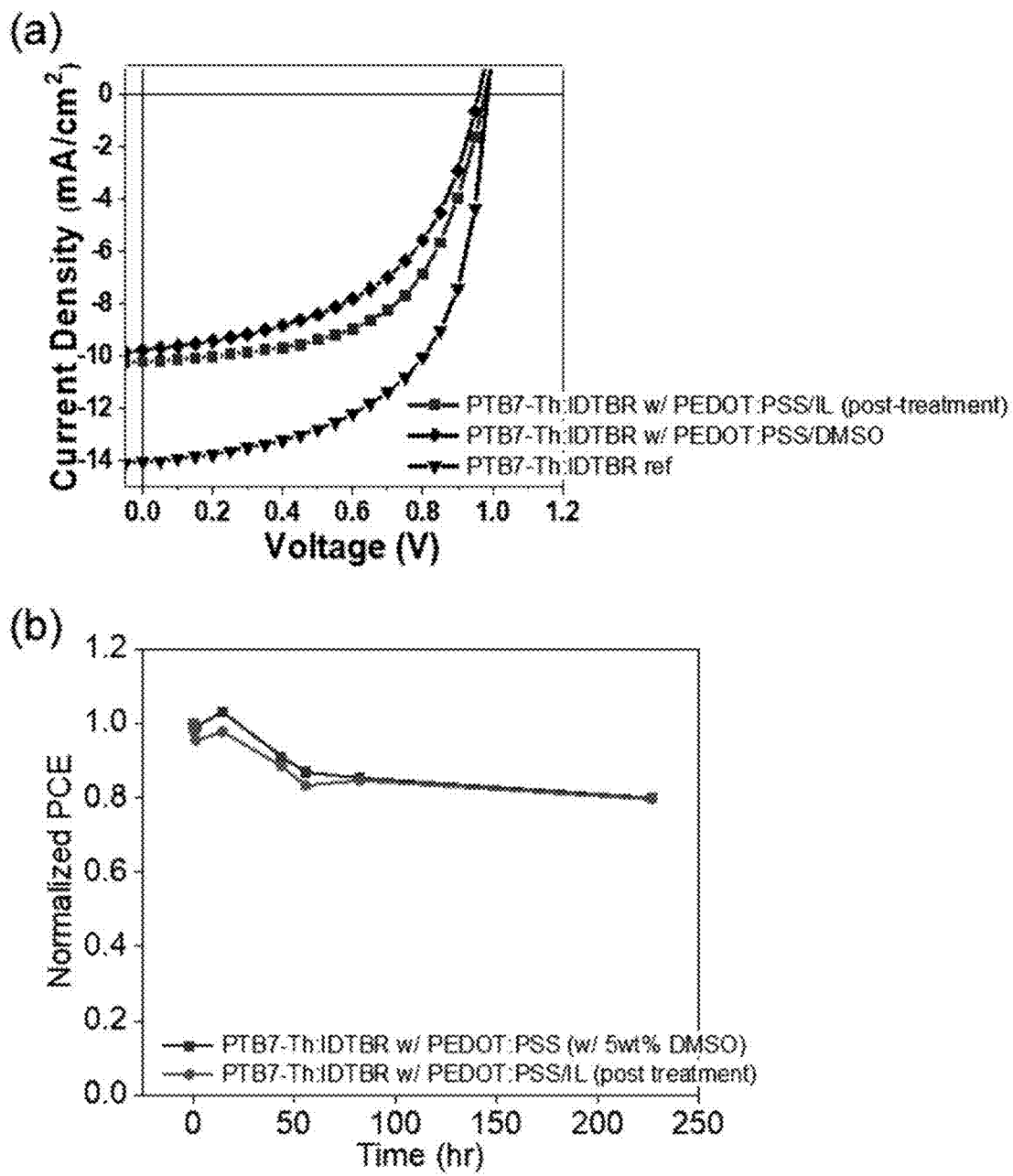

SOLAR CELL UPPER ELECTRODE AND MANUFACTURING METHOD THEREFOR

PRIORITY INFORMATION

This application is a Divisional of U.S. application Ser. No. 17/793,334, filed Jul. 15, 2022, which is a U.S. National Stage Application under 35 U.S.C. § 371 of International Application Number PCT/KR2021/005673, filed on May 6, 2021, which claims priority to Korea Application Serial No. 10-2020-0053986, filed May 6, 2020, the contents of which are incorporated herein by reference.

TECHNICAL FIELD

The present invention relates to a solar cell upper electrode and manufacturing method thereof.

BACKGROUND ART

As the use of energy is rapidly increasing worldwide with the development of technology, the demand for clean energy is increasing due to environmental problems such as global warming. Therefore, research and development of solar cell technology that produces electricity from sunlight, a clean energy source, is actively conducted.

In particular, among solar cells, organic solar cells have an extinction coefficient that is 1000 times higher than that of conventional silicon solar cells, maximizing the absorption of sunlight even with a very thin thickness. Therefore, it is possible to realize a low-cost solar cell, and it can be manufactured to be light and flexible due to the characteristics of the organic material, thereby increasing the usability.

In particular, an electrode capable of being subject to large-area printing and having high electrical conductivity and light transmittance is an essential element for the commercialization of transparent solar cells that can be used in displays and the like.

Accordingly, an electrode using PEDOT:PSS, a conductive polymer capable of large-area printing, was studied. PEDOT:PSS is attracting attention as a transparent electrode and hole transport layer material due to its excellent electrical properties, high transmittance in a visible light region, solution process compatibility in device fabrication, applicability and stability as flexible devices. As in the conventional art, when PEDOT:PSS is used as a lower electrode, it is used as an alternative electrode for inflexible and relatively expensive ITO.

However, research on using PEDOT:PSS as an upper electrode is incomplete. As a conventional upper electrode, a thin oxide/metal/oxide or oxide/metal thin film having a thickness of several tens of nm is mainly used. Since it is manufactured through vacuum deposition, productivity is low and the cost of equipment is high, so economic feasibility is insufficient. Therefore, research is required for utilizing PEDOT:PSS, which can be used for large-area printing and is inexpensive, as an upper electrode.

DOCUMENT OF RELATED ART (Patent Document 1) Korean Patent Laid-Open No. 10-2016-0027654

DISCLOSURE

Technical Problem

The technical object to be achieved by the present invention is to provide an upper electrode for a solar cell and manufacturing method thereof.

In addition, the technical object is to provide a solar cell to which an upper electrode for a solar cell according to an embodiment of the present invention is applied.

The technical objects to be achieved by the present invention are not limited to the technical objects mentioned above, and other technical objects not mentioned are clearly understood by those of ordinary skill in the art to which the present invention belongs from the following description.

Technical Solution

In order to achieve the above technical object, an embodiment of the present invention provides an upper electrode for a solar cell.

In the embodiment of the present invention, an upper electrode for a solar cell is located on a photoactive layer and includes a conductive polymer layer, wherein an ionic liquid is in contact with a surface of the conductive polymer layer to be post-treated, and an ion exchange reaction occurs only in an upper area of the conductive polymer layer by the post-treatment so that an ion pair generated by the ion exchange reaction does not penetrate into the photoactive layer.

In the embodiment of the present invention, the photoactive layer may include a polythiophene-based polymer, a polyfluorene-based polymer, a polyaniline-based polymer, a polycarbazole-based polymer, a polyvinylcarbazole-based polymer, a polyphenylene-based polymer, a polyphenylvinylene-based polymer, a polysilane-based polymer, a polyisothianaphthanene-based polymer, a polythiazole-based polymer, a polybenzothiazole-based polymer, a polythiopheneoxide-based polymer, or a copolymer thereof.

In the embodiment of the present invention, a conductive polymer of the conductive polymer layer may be PEDOT:PSS.

In the embodiment of the present invention, the ionic liquid may contain 1-ethyl-3-methylimidazolium tetracyanoborate ([EMIM$^+$ TCB$^-$]).

In the embodiment of the present invention, the upper area of the conductive polymer layer may have higher electrical conductivity than that of a lower area of the conductive polymer layer.

In order to achieve the above technical object, another embodiment of the present invention provides a solar cell including the above upper electrode for a solar cell.

In order to achieve the above technical object, still another embodiment of the present invention provides a method for manufacturing an upper electrode for a solar cell.

In the embodiment of the present invention, a method for manufacturing an upper electrode for a solar cell, includes the steps of forming a conductive polymer layer with a solution containing a conductive polymer on a photoactive layer; performing post-treatment with an ionic liquid on the conductive polymer layer; and rinsing the post-treated conductive polymer layer.

In the embodiment of the present invention, the photoactive layer may include a polythiophene-based polymer, a polyfluorene-based polymer, a polyaniline-based polymer, a polycarbazole-based polymer, a polyvinylcarbazole-based polymer, a polyphenylene-based polymer, a polyphenylvinylene-based polymer, a polysilane-based polymer, a polyisothianaphthanene-based polymer, a polythiazole-based polymer, a polybenzothiazole-based polymer, a polythiopheneoxide-based polymer, or a copolymer thereof.

In the embodiment of the present invention, the conductive polymer may be PEDOT:PSS.

In the embodiment of the present invention, the ionic liquid may contain 1-ethyl-3-methylimidazolium tetracyanoborate ([EMIM$^+$ TCB$^-$]).

In the embodiment of the present invention, the step of performing post-treatment may be performed by performing a printing process.

In the embodiment of the present invention, in the step of performing post-treatment, the ionic liquid may be in contact with a surface of the conductive polymer layer so that an ion exchange reaction occurs only in an upper area of the conductive polymer layer.

In the embodiment of the present invention, the step of drying the conductive polymer layer may be further included between the step of forming the conductive polymer layer and the step of performing post-treatment.

Advantageous Effects

The upper electrode for a solar cell according to an embodiment of the present invention is not subject to gelation, so it can improve its performance as an electrode, and it does not oxidize the photoactive layer located under the electrode, so it can be used as an upper electrode. Further, it is possible to improve the performance of the solar cell to which the upper electrode is applied.

In addition, it is possible to implement a more economical, flexible and transparent electrode by replacing an existing electrode.

In addition, by using a printing process, it can be more economical than an electrode using an existing deposition process.

The effect of the present invention is not limited to the above effect, and it should be understood to include all effects that can be inferred from the configuration of the invention described in the detailed description or claims of the present invention.

DESCRIPTION OF DRAWINGS

FIG. 1 is a schematic diagram of an upper electrode for a solar cell according to an embodiment of the present invention.

FIG. 2 is a flowchart of a method for manufacturing an upper electrode for a solar cell according to an embodiment of the present invention.

FIG. 3 is a schematic diagram of a method for manufacturing an upper electrode for a solar cell according to an embodiment of the present invention.

FIG. 4 shows a structural schematic diagram and XPS graph before and after mixing a conductive polymer and an ionic solution of Comparative Example 1 of the present invention.

FIG. 5 shows experimental images and graphs regarding the viscosity of a mixture solution of PEDOT:PSS and EMIM/TCB (IL) according to Comparative Example 1 of the present invention.

FIG. 6 shows absorbance graphs according to Comparative Example 1 of the present invention.

FIG. 7 shows comparative graphs of Comparative Example 1 and Preparation Example 1 according to an embodiment of the present invention.

FIG. 8 shows graphs of measurement of sheet resistance (Rsh) and transmittance (T) of Comparative Example 1 and Preparation Example 1 according to an embodiment of the present invention.

FIG. 9 shows images of a pristine PEDOT:PSS electrode, Comparative Example 1 and Preparation Example 1 measured by an atomic force microscopy (AFM) according to an embodiment of the present invention.

FIG. 10 shows performance graphs of solar cells according to each type of upper electrode according to an embodiment of the present invention.

FIG. 11 shows graphs of the relationship between solar cell performance and an average visible transmittance (AVT) according to an embodiment of the present invention.

FIG. 12 shows comparison graphs when using PEDOT:PSS/DMSO and PEDOT:PSS/IL as upper electrodes, according to an embodiment of the present invention.

MODE FOR INVENTION

Hereinafter, the present invention will be described with reference to the accompanying drawings. However, the present invention may be embodied in several different forms, and thus is not limited to the embodiments described herein. In addition, in order to clearly explain the present invention in the drawings, parts irrelevant to the description are omitted, and similar reference numerals are attached to similar parts throughout the specification.

Throughout the specification, when a part is said to be "connected (linked, contacted, coupled)" with another part, this includes not only a case where they are "directly connected" but also a case where they are "indirectly connected" with other members in the middle. In addition, when a part "comprises" a certain component, this means that other components may be further provided without excluding other components unless otherwise stated.

The terms used herein are used only to describe specific embodiments, and are not intended to limit the present invention. The singular expression includes the plural expression unless the context clearly dictates otherwise. In this specification, terms such as "comprise" or "have" are intended to designate that the described feature, number, step, operation, element, part, or a combination thereof exists, and should be understood that it does not preclude the existence or addition of one or more other features, numbers, steps, operations, elements, parts, or combinations thereof.

Conventionally, a thin oxide/metal/oxide or oxide/metal thin film with a thickness of several tens of nm were mainly used as an upper electrode of a transparent solar cell. However, since it was manufactured through vacuum deposition, productivity and economic efficiency were low.

Thus, in order to suggest an upper electrode using a conductive polymer capable of large-area printing, in the experiment of the present invention, a transparent electrode having high electrical conductivity was formed by using a mixture solution of a conductive polymer and an ionic liquid, but there were two problems. First, when the upper electrode was formed with the mixture solution, a chemical reaction occurred with the photoactive layer, thereby lowering the efficiency of a device. Second, the mixture solution immediately gelled, but when the electrode was formed by a printing process, the surface was not uniform, so it was difficult to guarantee the reliability of the electrode.

Therefore, the present invention is to propose an upper electrode for a solar cell that does not react with a photoactive layer while having a uniform surface and excellent performance.

An upper electrode for a solar cell according to an embodiment of the present invention will be described.

FIG. 1 is a schematic diagram of an upper electrode for a solar cell according to an embodiment of the present invention.

Referring to FIG. 1, an upper electrode for a solar cell is located on a photoactive layer, and includes a conductive polymer layer, an ionic liquid is in contact with a surface of the conductive polymer layer to be post-treated, and an ion exchange reaction occurs only in an upper area of the conductive polymer layer by the post-treatment so that an ion pair generated by the ion exchange reaction does not penetrate into the photoactive layer.

The photoactive layer may include a polythiophene-based polymer, a polyfluorene-based polymer, a polyaniline-based polymer, a polycarbazole-based polymer, a polyvinylcarbazole-based polymer, a polyphenylene-based polymer, a polyphenylvinylene-based polymer, a polysilane-based polymer, a polyisothianaphthanene-based polymer, a polythiazole-based polymer, a polybenzothiazole-based polymer, a polythiopheneoxide-based polymer, or a copolymer thereof, but is not limited thereto.

For example, it may include poly(3-hexylthiophene) (P3HT) or poly[[4,8-bis[(2-ethylhexyl)oxy]benzo[1,2-b:4,5-b']-dithiophene-2,6-diyl][3-fluoro-2-[(2-ethylhexyl)carbonyl]-thieno[3,4-b]thiophenediyl]] (PTB7), which is one kind of the polythiophene-based polymer. For example, the photoactive layer may include P3HT:$PC_{61}BM$ or PTB7-Th:IDTBR. The PTB7-Th is poly[4,8-bis(5-(2-ethylhexyl)-thiophen-2-yl)benzo[1,2-b:4,5-b']dithiopheneco-3-fluorothieno[3,4-b]thiophene-2-carboxylate], and the $PC_{61}BM$ is [6,6]-phenyl-C61-butyric acid methyl ester.

The conductive polymer of the conductive polymer layer may be PEDOT:PSS. PEDOT:PSS (poly(3,4-ethylenedioxythiophene):poly(styrene sulfonate)) is a polymer that can be used as a transparent electrode by replacing the ITO electrode or metal electrode, which lacks flexibility. Since PEDOT:PSS is a polymer material, it is physically flexible and dissolves in solvents, so low-cost printing and solution processes are possible. PEDOT is insoluble in solvents, but by using PSS, PEDOT can be dispersed in an aqueous phase.

The ionic liquids (ILs) may include 1-ethyl-3-methylimidazolium tetracyanoborate ([$EMIM^+$ $TCB^-$]).

General PEDOT:PSS is difficult to use as an electrode alone because of the low conductivity of $10^{-5}$ S/cm to $10^{-3}$ S/cm. However, when it comes into contact with an ionic liquid, the electrical conductivity can be greatly improved by forming ion pairs through an ion exchange reaction and removing non-conductive ion pairs through a subsequent rinsing process.

For example, [$EMIM^+$ $TCB^-$] of the ionic liquid and [$H^+$ $PSS^-$] of PEDOT:PSS undergo an ion exchange reaction to form an ion pair of [$EMIM^+$ $PSS^-$] and [$H^+$ $TCB^-$]. Thereafter, by inducing a decrease in the π-π stacking distance between the PEDOTs by removing the excess PSS having an insulation property, the electrical conductivity, which is somewhat lacking as an electrode of PEDOT:PSS, is greatly improved and can be used as an electrode. By removing the excess PSS in this way, PSS is present in the electrode at a lower content than the content of PSS initially included in the conductive polymer. For example, the content of PSS may be 40% of the initial content.

However, when the electrode formed after first mixing the ionic liquid and the conductive polymer is used as an upper electrode, the hydrogen cation ($H^+$) or the negative charge ($TCB^-$) of the ionic liquid moves to the photoactive layer underneath to cause a reaction, so that the performance of a device can be reduced. Thus, in the present invention, the electrode is formed by first forming a conductive polymer layer and then contacting the ionic liquid thereon to be post-treated, rather than forming an electrode by mixing the conductive polymer and the ionic liquid.

The post-treatment may be performed by contacting the surface of the conductive polymer layer with an ionic liquid so that the ion exchange reaction occurs only in the upper area of the conductive polymer layer. For example, it may be carried out by contacting the ionic liquid at a concentration of 2% by weight to 3% by weight based on a total weight for 1 minute to 30 minutes.

By the post-treatment, the ion exchange reaction between the conductive polymer and the ionic liquid occurs only in the upper area of the conductive polymer layer, so that the ion pair may not penetrate into the photoactive layer.

That is, unlike the conventional electrode formed by mixing the conductive polymer and the ionic liquid, the electrode subjected to the post-treatment has a lower area of the conductive polymer layer (PEDOT:PSS) that does not react with the ionic liquid, which serves to prevent the ions containing the hydrogen cation ($H^+$) or the negative charge ($TCB^-$) of the ionic liquid from penetrating into the photoactive layer. Accordingly, it is possible to prevent degradation of the photoactive layer.

The upper area of the ionic polymer layer is a region in which the ion exchange reaction occurs by the post-treatment, and may be positioned far from the photoactive layer so as not to transmit ion pairs to the photoactive layer. In addition, the lower area of the ionic polymer layer is a region in which the ion exchange reaction does not occur, and may be located close to or in close contact with the photoactive layer. The upper area and the lower area may be appropriately adjusted by the concentration or time of the ionic liquid during the post-treatment.

The upper area of the conductive polymer layer may have higher electrical conductivity than that of the lower area in which the ion exchange reaction does not occur. This is because the ionic liquid penetrates only to the upper area of the conductive polymer layer and performs the ion exchange reaction, so PSS is removed only in the upper area of the conductive polymer layer in the subsequent rinsing process.

That is, the upper area of the conductive polymer layer may have a lower PSS content than that of the lower area.

In addition, when the electrode formed after first mixing the ionic liquid and the conductive polymer is used as the upper electrode, the ion pair [$EMIM^+$ $PSS^-$] formed by the ion exchange reaction between [$EMIM^+$ $TCB^-$] of the ionic liquid and [$H^+$ $PSS^-$] of the PEDOT:PSS gels the solution and increases its viscosity, making it difficult to achieve a smooth surface of the electrode. However, since in the upper electrode using the post-treatment process, the conductive polymer layer (e.g., PEDOT:PSS layer) is first coated and then the ionic solution is treated, the gelation reaction between the conductive polymer layer in a solid state (e.g., PEDOT:PSS layer) and the ionic liquid can be blocked.

A root mean square (RMS) roughness of the electrode subjected to the post-treatment may be, for example, 2.99 nm. This is smaller than the RMS roughness (e.g., 5.78 nm) of the electrode formed after first mixing the ionic liquid and the conductive polymer, which is a comparative example. The smaller the RMS roughness, the smaller the curvature of the electrode surface, so it may be an ideal electrode. As the gelation occurs, the RMS roughness increases.

Another embodiment of the present invention describes a solar cell using the post-treated upper electrode.

The solar cell may be an organic solar cell, and as long as it is a solar cell that can utilize the upper electrode according to an embodiment of the present invention, it is not limited thereto.

A solar cell using the post-treated upper electrode may have a structure including, for example, a substrate/lower electrode/photoactive layer/upper electrode.

The substrate may include indium-tin oxide (ITO), but is not limited thereto.

The lower electrode may include ZnO nanoparticle (NP), but is not limited thereto.

The photoactive layer may include a polythiophene-based polymer, a polyfluorene-based polymer, a polyaniline-based polymer, a polycarbazole-based polymer, a polyvinylcarbazole-based polymer, a polyphenylene-based polymer, a polyphenylvinylene-based polymer, a polysilane-based polymer, a polyisothianaphthanene-based polymer, a polythiazole-based polymer, a polybenzothiazole-based polymer, a polythiopheneoxide-based polymer, or a copolymer thereof, but is not limited thereto. For example, poly(3-hexylthiophene) (P3HT) or poly[[4,8-bis[(2-ethylhexyl)oxy]benzo[1,2-b:4,5-b']-dithiophene-2,6-diyl][3-fluoro-2-[(2-ethylhexyl)carbonyl]-thieno[3,4-b]thiophenediyl]] (PTB7) may be included.

Although the upper electrode is located on the photoactive layer of the solar cell, since the ionic liquid reacts only in the upper area of the conductive polymer layer, it can prevent acid ions (e.g., hydrogen cation ($H^+$) or $TCB^-$) from penetrating into the photoactive layer and reacting, so that the P-type oxidative doping does not occur in the photoactive layer, thereby preventing the deterioration of the performance. Accordingly, the performance of the solar cell can be improved when the upper electrode of an embodiment of the present invention is introduced.

In addition, since the upper electrode does not undergo gelation, the performance of the solar cell can be improved.

Another embodiment of the present invention describes a method for manufacturing an upper electrode for a solar cell.

FIG. 2 is a flowchart of a method for manufacturing an upper electrode for a solar cell according to an embodiment of the present invention.

FIG. 3 is a schematic diagram of a method for manufacturing an upper electrode for a solar cell according to an embodiment of the present invention.

Referring to FIGS. 2 and 3, a method for manufacturing the upper electrode for a solar cell includes the steps of forming a conductive polymer layer with a solution containing a conductive polymer on the photoactive layer (S100); post-treatment with an ionic liquid on the conductive polymer layer (S200); and rinsing the post-treated conductive polymer layer (S300).

First, a conductive polymer layer is formed with a solution containing a conductive polymer on the photoactive layer (S100).

The photoactive layer includes a polythiophene-based polymer, a polyfluorene-based polymer, a polyaniline-based polymer, a polycarbazole-based polymer, a polyvinylcarbazole-based polymer, a polyphenylene-based polymer, polyphenylvinylene-based polymer, a polysilane-based polymer, a polythiazole-based polymer, a polyisothianaphthanene-based polymer, polybenzothiazole-based polymer, a polythiopheneoxide-based polymer, or a copolymer thereof, but is not limited thereto. For example, the photoactive layer may include P3HT or PTB7.

The conductive polymer may be PEDOT:PSS.

For example, the conductive polymer layer may be formed on the photoactive layer by performing a printing process or a wet process with a solution containing the conductive polymer.

The printing process may be performed using a doctor blade. For example, the doctor blade may have a gap of 0.1 mm and a blade angle of 45° at a blade speed of 2.5 mm s$^{-1}$.

The wet process may be spin coating, roll coating, dip coating, or spray coating, but is not limited thereto. For example, the spin coating may be performed at 2000 rpm.

Next, post-treatment is performed with an ionic liquid on the conductive polymer layer (S200).

The ionic liquid may be 1-ethyl-3-methylimidazolium tetracyanoborate ([EMIM$^+$ TCB$^-$]).

The post-treatment may be performed by, for example, a printing process.

The printing process can be performed using a doctor blade (FIG. 3(a)). For example, the doctor blade may have a gap of 0.1 mm, and a blade angle of 45° at a blade speed of 2.5 mm s$^{-1}$.

Since the post-treatment is to contact the ionic liquid on the surface of the conductive polymer layer so that the ion exchange reaction occurs only in the upper area of the conductive polymer layer, the ion pair generated by the ion exchange reaction does not penetrate into the photoactive layer, so that it does not oxidize the photoactive layer (FIG. 3(b)).

The post-treatment may be to contact the ionic liquid on the surface of the conductive polymer layer so that the ion exchange reaction occurs only in the upper area of the conductive polymer layer.

For example, the post-treatment may be performed by contacting the ionic liquid at a concentration of 2% by weight to 3% by weight based on a total weight for 1 minute to 30 minutes. In this embodiment, when the ionic liquid is contacted for less than 1 minute, the ion-pairing reaction does not occur sufficiently, so that the electrical conductivity may not be increased as much as desired, and when the ionic liquid is contacted for more than 30 minutes, $H^+$ or $TCB^-$ may penetrate into the photoactive layer to cause a reaction.

The concentration and time of the ionic liquid may be appropriately adjusted to such an extent that the ion pair of $H^+$ or $TCB^-$ does not penetrate into the photoactive layer.

In the ion exchange reaction, [EMIM$^+$ TCB$^-$] of the ionic liquid and [H$^+$ PSS$^-$] of PEDOT:PSS undergo the ion exchange reaction to form the ion pairs of [EMIM$^+$ PSS$^-$] and [H$^+$ TCB$^-$]. Therefore, since the lower area of the conductive polymer layer prevents penetration of the hydrogen cation ($H^+$) or $TCB^-$ into the photoactive layer, P-type oxidative doping may not occur in the photoactive layer, thereby stably utilizing it as an upper electrode of a solar cell.

Since the post-treatment does not oxidize the photoactive layer because it does not use a conventional method of immersion in a post-treatment solution (e.g., acid), the electrode manufactured by the post-treatment method of the present invention can be used as an upper electrode.

In addition, the post-treated electrode of the present invention is not gelated, which can be compared with an electrode formed of a mixture solution in which the ionic liquid and the conductive polymer are first mixed. First, when an electrode is formed with a mixture solution in which the ionic liquid and the conductive polymer are first mixed, [EMIM$^+$ TCB$^-$] of the ionic liquid and [H$^+$ PSS$^-$] of the PEDOT:PSS undergo an ion exchange reaction to form the ion-pair of [EMIM$^+$ PSS$^-$], and the ion-pair of [EMIM$^+$ PSS$^-$] gels the solution and increases the viscosity, making it difficult to implement a smooth surface of the electrode. However, since in the upper electrode subject to the post-treatment process, the conductive polymer layer (e.g., PEDOT:PSS layer) is first coated and then treated with the ionic solution, the gelation between the conductive polymer layer in a solid state (e.g., PEDOT:PSS layer) and the ionic liquid can be blocked. Therefore, it is possible to perform an economical printing process compared to the deposition process and to form a smooth electrode.

Next, the post-treated conductive polymer layer is rinsed (S300).

The rinsing may be performed using deionized water.

The ion pairs generated by the post-treatment can be removed by rinsing with deionized water, and excess PSS-having insulation property is removed in this process, thereby greatly improving the electrical conductivity of the electrode.

For example, after forming PEDOT:PSS on the photoactive layer containing P3HT, the electrode post-treated with the ionic liquid may have an electrical conductivity (σ) of 1810 S/cm.

Additionally, between the step of forming the conductive polymer layer and the post-treatment step, the step of drying the conductive polymer layer may be further included.

For example, the conductive polymer layer formed by a printing process or a wet process can be dried by applying heat of 120° C. for 10 minutes on a hot plate.

Preparation Example 1—Manufacturing of an Upper Electrode for a Solar Cell

PEDOT:PSS solution (Clevios PH1000) was purchased from Heraeus, Germany.

For the preparation of an ionic solution (EMIM/TCB), potassium tetracyanoborate (K[B(CN)4]) and 1-ethyl-3-methylimidazolium chloride were purchased from Fluorochem Ltd. and synthesized.

First, the PEDOT:PSS solution was spin-coated at 2000 rpm, or printed on a glass substrate on which infrared-ozone was treated for 20 minutes by a doctor blade having a blade angle of 45° at a blade speed of 2.5 mm s$^{-1}$ with a gap of 0.1 mm to form a PEDOT:PSS film. Next, the printed film was dried by applying heat of 120° C. for 10 minutes on a hot plate. Next, 2% by weight of EMIM/TCB solution was printed on the PEDOT:PSS film with the doctor blade having a gap of 0.1 mm and a blade angle of 45° at a blade speed of 2.5 mm s$^{-1}$, and then, rinsed with deionized water, so the upper electrode for a solar cell was manufactured.

Comparative Example 1

First, EMIM/TCB was diluted to a concentration of 2% by weight in deionized water, and 1 g of a PEDOT:PSS solution was added, followed by stirring at room temperature for 12 hours at 500 rpm to prepare the mixture solution of PEDOT:PSS and the ionic solution. Next, the mixture solution was spin-coated at 2000 rpm, or, printed on the glass substrate treated with infrared-ozone for 20 minutes by the doctor blade having a blade angle of 45° at a blade speed of 2.5 mm s$^{-1}$ with a gap of 0.1 mm. Next, the printed film was dried by applying heat of 120° C. for 10 minutes on a hot plate, and then rinsed with deionized water to manufacture an upper electrode for a solar cell.

Preparation Example 2—Manufacturing of a Solar Cell

The structure of a solar cell may include ITO/ZnO NP/P3HT:PC$_{61}$BM or PTB7-Th:EH-IDTBR/PEDOT:PSS/IL. The ZnO NP solution was purchased from Nano Clean Tech (NCT-10, 4.2 eV, 12 nm). In addition, P3HT:PC$_{61}$BM solution (1.3:1, w/w) and PTB7-Th:EH-IDTBR (1.3:1, w/w) were purchased from Nano Clean Tech.

First, a patterned ITO electrode was manufactured, and a ZnO NP solution was spin-coated on ITO at 2000 rmp for 30 seconds. Next, NP/P3HT:PC$_{61}$BM or PTB7-Th: IDTBR solution was spin-coated on the ZnO NP layer, and then, annealed at 150° C. for 10 minutes. Next, as in Preparation Example 1, the upper electrode was coated to manufacture a solar cell.

Comparative Example 2-A

First, a patterned ITO electrode was manufactured, and a ZnO NP solution was spin-coated on ITO at 2000 rmp for 30 seconds. Next, NP/P3HT:PC$_{61}$BM or PTB7-Th: IDTBR solution was spin-coated on the ZnO NP layer, and then, annealed at 150° C. for 10 min. Next, as in Comparative Example 1, the upper electrode was coated to manufacture a solar cell.

Comparative Example 2-B

First, a patterned ITO electrode was manufactured and a Zno NP solution was spin-coated on ITO at 2000 rmp for 30 seconds. Next, NP/P3HT:PC$_{61}$BM solution was spin-coated on the ZnO NP layer, and then, annealed at 150° C. for 10 minutes. Next, the upper electrode for a solar cell was manufactured by vacuum-depositing Ag at 10$^{-6}$ torr or less.

Experimental Example

FIG. 4 shows a structural schematic diagram and XPS graph before and after mixing the conductive polymer and the ionic solution of Comparative Example 1.

Referring to FIG. 4, (a) shows a structure in which the ion pairs of [H$^+$ TCB$^-$] and [EMIM$^+$ PSS$^-$] were formed by the ion exchange between PEDOT:PSS and EMIM/TCB, (b) shows the gelation occurred after the mixture solution of PEDOT:PSS and EMIM/TCB underwent ion exchange, and (c) shows the electrode formation with the mixture solution of PEDOT:PSS and EMIM/TCB (IL) by observing B 1 s and N 1 s through XPS analysis.

FIG. 5 shows experimental images and graphs regarding the viscosity of the mixture solution of PEDOT:PSS and EMIM/TCB (IL) according to Comparative Example 1 of the present invention.

Referring to FIG. 5, (a) shows a viscosity experiment of a pristine PEDOT:PSS solution and a PEDOT:PSS/IL mixture solution. Unlike the pristine PEDOT:PSS solution, if a bottle containing the PEDOT:PSS/IL mixture solution was turned over after 1 hour, it was confirmed that it had already hardened and did not fall to the floor. (b) shows a viscosity graph for this. (c) shows a phenomenon of gelation when manufacturing a composite electrode with the PEDOT:PSS/IL mixture solution, and (d) shows a graph measuring the thickness deviation of the coated composite electrode according to the printing distance of the mixture solution. It was found that the pristine PEDOT:PSS electrode was smooth, whereas the composite electrode manufactured with the PEDOT:PSS/IL mixture solution had a large degree of roughness.

FIG. 6 shows absorbance graphs according to Comparative Example 1 of the present invention.

Referring to FIG. 6, (a) shows the molecular structure of the photoactive layer. As shown in (b), when only the photoactive layer (P3HT) was present, a band edge was almost 680 nm and there was no absorption in the NIR region, whereas when PEDOT:PSS/IL was present on the photoactive layer, a new NIR absorption peak was shown and it gradually increased as the concentration of the ionic liquid (IL) increased. This shows that as the ionic liquid concentration of the PEDOT:PSS/IL mixture solution increased in the photoactive layer, a mid-gap state called polaron was created. As shown in (c), P3HT film, and P3HT film coated with PSS, IL, or PSS/IL mixture solution were prepared to measure the origin of polaronic absorption of the photoactive layer. First, as a result of light absorption spectrum measurement, it was found that there was no significant chemical interaction between P3HT and PSS or between P3HT and IL. However, when the PSS/IL mixture solution was coated, a polaron absorption peak was observed in a near-infrared range. As shown in (d), similarly, in the case of PTB7-Th film, a small polar absorption peak appeared when the PSS/IL mixture solution was coated. The thiophene ring is easily protonated by a strong proton donor, which is called P-type oxidative doping. In the PSS/IL mixture solution, [$H^+$ $TCB^-$] can penetrate into the photoactive layer having a thiophene ring and oxidize. As shown in (e), when the PEDOT:PSS was coated, the photoluminescence (PL) intensity of P3HT was slightly lowered because of PL quenching at the junction of the metal phase of PEDOT:PSS. However, when the PEDOT:PSS/IL mixture solution was coated, the PL intensity was very low, which was consistent with the UV-vis-NIR absorption data, indicating that there was a strong PL quenching center. (f) shows that the PTB7-Th photoactive layer film showed a similar trend, regarding the PL intensity. Through this, it was confirmed that the PEDOT:PSS/IL mixture solution was not suitable for use as a reliable transparent electrode.

FIG. 7 shows comparative graphs of an electrode formed of a PEDOT:PSS/IL mixture solution (Comparative Example 1) and an electrode in which PEDOT:PSS/IL is sequentially formed (Preparation Example 1).

Referring to FIG. 7, (a) shows that the electrode in which PEDOT:PSS/IL was sequentially formed (post-treated electrode, Preparation Example 1) had a stronger photoluminescence (PL) intensity than that of the electrode formed of the PEDOT:PSS/IL mixture solution (Comparative Example 1), because [$H^+$ $TCB^-$] did not penetrate into the P3HT photoactive layer. (b) shows that similar results were found when using the PTB7 photoactive layer. (c) shows that in Preparation Example 1, polar absorption did not occur in the wavelength range of 650 nm to 1100 nm through a light absorption spectrum, which confirmed that the PEDOT:PSS layer protected the photoactive layer underneath.

FIG. 8 shows graphs measuring the sheet resistance (Rsh) and transmittance (T) of an electrode formed of a PEDOT:PSS/IL mixture solution (Comparative Example 1) and an electrode in which PEDOT:PSS/IL is sequentially formed (Preparation Example 1).

Referring to FIG. 8, (a) shows that for the sheet resistance ($R_{sh}$) and transmittance (T550 nm), the PEDOT:PSS/IL composite electrode had almost overlapped fitted curve regardless of the manufacturing method. Further, the electrical conductivity ($\sigma$) of the electrode in which PEDOT:PSS/IL was sequentially formed (Preparation Example 1) was 1810 S/cm, which was higher than 1690 S/cm of the electrode formed of the PEDOT:PSS/IL mixture solution. (b) shows that both films had similar light transmittance at similar sheet resistance ($R_{sh}$), and the figure of merit was also similar (FoM=$\sigma_{dc}/\sigma_{op}\approx 39$) for both films.

TABLE 1

| Electrodes | Pristine PEDOT:PSS (before treatment) | After IL treatment + rinsed with deionized water |
|---|---|---|
| PEDOT:PSS/IL mixture | 5.1 eV | 5.0 to 5.1 eV |
| PEDOT:PSS/IL post-treatment | 5.1 eV | 5.0 to 5.1 eV |

Table 1 shows the work function measured using a Kelvin probe measurement system, and both electrodes were similar. This means that sequentially printed electrodes can be used as a reliable upper electrode. FIG. 9 shows images of a pristine PEDOT:PSS electrode, Comparative Example 1 and Preparation Example 1 measured by an atomic force microscopy (AFM) according to an embodiment of the present invention.

Referring to FIG. 9, (a) shows the surface of a pristine PEDOT:PSS electrode which had a smooth surface with a root mean square (RMS) roughness of about 2.50 nm. (b) shows the PEDOT:PSS electrode post-treated with IL (Preparation Example 1) which had an RMS roughness of 2.99 nm due to the growth of nanofibril-like fibers, and a strong π-π interaction between PEDOT:PSS molecules during ion exchange. (c) shows that the electrode formed of the PEDOT:PSS/IL mixture solution (Comparative Example 1) also had the nanofibril-like fibers, and that the RMS roughness was about 5.78 nm, which was much rougher than the aforementioned electrode. It was confirmed that the electrode formed of the PEDOT:PSS/IL mixture solution was gelated due to [$EMIM^+$ $PSS^-$]. (d) shows that the PEDOT:PSS electrode post-treated with IL (Preparation Example 1) did not show significant morphological changes such as gelation over time.

FIG. 10 shows performance graphs of solar cells according to each type of upper electrode according to an embodiment of the present invention.

Referring to FIG. 10, (a) is a schematic diagram of a solar cell according to an embodiment of the present invention. (b) is an energy level diagram of an organic solar cell according to an embodiment of the present invention. As shown in (c) and (d), when Ag was used as an upper electrode, $V_{oc}$ was 0.52 V, a power conversion efficiency (PCE) at $J_{sc}$ of 8.00 mA cm$^{-2}$ was 2.60%, and a fill factor (FF) was 0.56 in the P3HT: $PC_{61}BM$-based electrode. In addition, in the PTB7-Th: IDTBR-based electrode, $V_{oc}$ was 0.99 V, the PCE at $J_{sc}$ of 14.11 mA cm$^{-2}$ was 8.50%, and the fill factor (FF) was 0.61. However, when the upper electrode formed of the PEDOT:PSS/IL mixture solution was used, the performances of all solar cells were weakened regardless of the type of the photoactive layer material. This was because [$H^+$ $TCB^-$] penetrated into the photoactive layer and the reaction occurred, which was consistent with UV-vis absorption and PL data. As shown in (e) and (f), the solar cell including the upper electrode in which PEDOT:PSS was post-treated with IL (Preparation Example 2) exhibited relatively high external quantum efficiency (EQE) than that of the electrode formed with the PEDOT:PSS/IL mixture solution (Comparative Example 2-A). Preparation Example 2 had slightly lower EQE than that of the case of using Ag as the upper electrode (Comparative Example 2-B), but this resulted in the photocurrent increase effect due to the light reflected through the Ag electrode and the relatively low conductivity of the composite electrode compared to the Ag electrode. The external quantum efficiency of the upper electrode in which PEDOT:PSS was post-treated with IL shown in the graph is a sufficiently predictable level.

FIG. 11 shows graphs of the relationship between solar cell performance and an average visible transmittance (AVT) according to an embodiment of the present invention.

TABLE 2

| Device (PTB7-Th:IDTBR w/PEDOT:PSS/IL, 2.5 mm/s blade speed) | $J_{sc}$ (mA/cm$^2$) | $V_{oc}$ (V) | Fill factor | Average PCE(%) | Maximum PCE(%) | $R_s$ ($\Omega \cdot cm^2$) | $R_{sh}$ ($\Omega \cdot cm^2$) | AVT (%) |
|---|---|---|---|---|---|---|---|---|
| Thickness of photoactive layer 67 nm | 7.980 | 0.97 | 0.61 | 4.40 | 4.70 | 11.06 | 1705 | 47.9 |
| 86 nm | 9.510 | 0.98 | 0.61 | 5.50 | 5.65 | 9.777 | 1308 | 40.6 |
| 104 nm | 10.680 | 0.98 | 0.58 | 5.96 | 6.05 | 11.291 | 994.6 | 35.3 |
| 126 nm | 11.35 | 0.98 | 0.57 | 5.97 | 6.32 | 9.576 | 904.4 | 35.4 |
| 136 nm | 11.560 | 0.98 | 0.55 | 6.17 | 6.24 | 14.52 | 896.23 | 31.8 |
| 159 nm | 11.550 | 0.99 | 0.54 | 6.08 | 6.18 | 15.17 | 778.4 | 30.0 |
| PTB7-Th:IDTBR ref (opaque) | 14.113 | 0.99 | 0.61 | 7.97 | 8.50 | 3.635 | 721.2 | 0 |

TABLE 3

| Device (illumination side:ITO)) | $J_{sc}$ (mA/cm$^2$) | $V_{oc}$ (V) | Fill factor | Av. PCE(%) | Max PCE(%) | PEDOT:PSS/IL $R_{sheet}$ ($\Omega/\square$) | PEDOT:PSS/IL thickness (nm) | $R_s$ ($\Omega \cdot cm^2$) | $R_{sh}$ ($\Omega \cdot cm^2$) | AVT (%) |
|---|---|---|---|---|---|---|---|---|---|---|
| PTB7-Th:IDTBR w/ PEDOT:PSS/IL 2.5 mm/s | 11.35 | 0.98 | 0.57 | 5.97 | 6.32 | 38.1 | 415 | 9.576 | 904.4 | 35.4 |
| w/ PEDOT:PSS/IL 5.0 mm/s | 11.69 | 0.98 | 0.57 | 6.33 | 6.55 | 24.9 | 561 | 9.740 | 952.6 | 28.7 |
| w/ PEDOT:PSS/IL 7.5 mm/s | 11.32 | 0.98 | 0.56 | 6.13 | 6.16 | 25.6 | 735 | 13.93 | 839.1 | 29.4 |
| w/ PEDOT:PSS/IL 10.0 mm/s | 11.23 | 0.98 | 0.56 | 5.91 | 6.09 | 25.2 | 678 | 13.58 | 850.0 | 28.5 |
| w/ PEDOT:PSS/IL 12.5 mm/s | 11.10 | 0.97 | 0.56 | 5.8 | 6.07 | 22.7 | 889 | 13.62 | 928.5 | 3 |
| w/ PEDOT:PSS/IL 15.0 mm/s | 11.81 | 0.98 | 0.56 | 6.15 | 6.33 | 19.9 | 904 | 14.88 | 859.3 | 20.7 |
| PTB7-Th:IDTBR ref (opaque) | 14.11 | 0.99 | 0.61 | 7.97 | 8.50 | To 0.1 | — | 3.635 | 721.2 | 0 |

TABLE 4

| Device (Illumination side:PEDOT:PSS/IL) | $J_{sc}$ (mA/cm$^2$) | $V_{oc}$ (V) | Fill factor | Av. PCE(%) | Max PCE(%) | PEDOT:PSS/IL $R_{sheet}$ ($\Omega/\square$) | PEDOT:PSS/IL thickness (nm) | $R_s$ ($\Omega \cdot cm^2$) | $R_{sh}$ ($\Omega \cdot cm^2$) | AVT (%) |
|---|---|---|---|---|---|---|---|---|---|---|
| PTB7-Th:IDTBR w/ PEDOT:PSS/IL 2.5 mm/s | 9.71 | 0.98 | 0.60 | 5.47 | 5.66 | 38.1 | 415 | 9.449 | 1179 | 35.4 |
| w/ PEDOT:PSS/IL 5.0 mm/s | 8.31 | 0.97 | 0.60 | 4.58 | 4.87 | 24.9 | 561 | 10.40 | 1583 | 28.7 |
| w/ PEDOT:PSS/IL 7.5 mm/s | 7.63 | 0.97 | 0.58 | 4.24 | 4.27 | 25.6 | 735 | 14.22 | 1330 | 29.4 |
| w/ PEDOT:PSS/IL 10.0 mm/s | 7.04 | 0.96 | 0.56 | 3.61 | 3.76 | 25.2 | 678 | 14.56 | 1359 | 28.5 |

TABLE 4-continued

| Device (Illumination side:PEDOT:PSS/IL) | $J_{sc}$ (mA/cm$^2$) | $V_{oc}$ (V) | Fill factor | Av. PCE(%) | Max PCE(%) | PEDOT:PSS/IL $R_{sheet}$ (Ω/□) | PEDOT:PSS/IL thickness (nm) | $R_s$ (Ω·cm$^2$) | $R_{sh}$ (Ω·cm$^2$) | AVT (%) |
|---|---|---|---|---|---|---|---|---|---|---|
| w/ PEDOT:PSS/IL 12.5 mm/s | 6.26 | 0.96 | 0.58 | 3.32 | 3.47 | 22.7 | 889 | 1.4.25 | 1685 | 22.3 |
| w/ PEDOT:PSS/IL 15.0 mm/s | 6.44 | 0.95 | 0.56 | 3.36 | 3.42 | 19.9 | 9.4 | 16.65 | 1513 | 20.7 |
| PTB7-Th:IDTBR ref (opaque) | 14.11 | 0.99 | 0.61 | 7.97 | 8.50 | To 0.1 | | 3.635 | 721.2 | 0 |

Referring to FIG. 11 and Tables 2 to 4, as shown in (a) and Table 2, the thickness of the photoactive layer was controlled in order to examine the relationship between solar cell performance and an average visible transmittance (AVT) in a visible range. As shown in (b) and Table 3, the performance of ST-OSC (a semi-transparent organic solar cell) was similar when illuminated from the ITO side, regardless of the thickness of PEDOT:PSS. However, as shown in (c) and Table 4, when illuminated to the PEDOT: PSS side, as the thickness of PEDOT:PSS increased, the PEDOT:PSS layer absorbed light and the solar cell performance gradually decreased. (d) and (e) show the power conversion efficiency (PCE) and average visible transmittance (AVT) of the semi-transparent PTB7-Th:IDTBR solar cell with respect to the thickness of the photoactive layer. When the thickness of the photoactive layer was about 120 nm, it was found that the performance was optimized by showing PCE of 6.32% at AVT of 35.4%. As shown in Table 2, the transmittance of the solar cell at about 450 nm exceeded 60%. FIG. 12 shows comparison graphs when using PEDOT:PSS/DMSO and PEDOT:PSS/IL as upper electrodes, according to an embodiment of the present invention.

TABLE 5

| Electrodes | $J_{sc}$ (mA/cm$^2$) | $V_{oc}$ (V) | Fill factor | PCE(%) | Conductivity (S/cm) | Transmittance(%) | Work function (eV) |
|---|---|---|---|---|---|---|---|
| PEDOT:PSS/IL post-treatment | 10.20 | 0.98 | 0.58 | 5.75 | 1810 | 93.3 | 5.1 |
| PEDOT:PSS w/DMSO 5 wt % | 9.75 | 0.96 | 0.52 | 4.88 | 908 | 93.4 | 5.1 |
| Ag (reference) | 14.03 | 0.99 | 0.59 | 8.09 | — | — | — |

Referring to FIG. 12 and Table 5, in (a), the measurement was performed by controlling the thickness of the upper electrode to about 90 nm, and the PEDOT:PSS/IL electrode exhibited higher performance than that of the comparative electrode (Comparative Example 2-B). In addition, in (b), the stability of the electrode was measured in a glove box filled with $N_2$ in order to prevent a decrease in performance due to air. It was found that both the electrodes formed of PEDOT:PSS [w/5% by weight of dimethyl sulfoxide (DMSO)] and PEDOT:PSS/IL exhibited similar degradation in performance over time. Therefore, it was confirmed that the effect of the [H$^+$ TCB$^-$] residue of PEDOT:PSS/IL was negligible with respect to the stability of the solar cell.

The upper electrode for a solar cell according to an embodiment of the present invention is not gelated, so it can have improved performance as an electrode. The upper electrode does not oxidize the photoactive layer located under the electrode, so it can be used as an upper electrode and it can improve the performance of a solar cell to which the upper electrode is applied. In addition, it is possible to implement a more economical, flexible and transparent electrode by replacing an existing electrode. In addition, by using a printing process, it can be more economical than the electrode using an existing deposition process.

The above description of the present invention is for illustration, and those of ordinary skill in the art to which the present invention pertains can understand that it can be easily modified into other specific forms without changing the technical spirit or essential characteristics of the present invention. Therefore, it should be understood that the embodiments described above are illustrative in all respects and not restrictive. For example, each component described as a single type may be implemented in a distributed manner, and likewise components described as distributed may also be implemented in a combined form.

The scope of the present invention is indicated by the following claims, and all changes or modifications derived from the meaning and scope of the claims and their equivalents should be construed as being included in the scope of the present invention.

The invention claimed is:

1. A method for manufacturing an upper electrode for a solar cell, comprising the steps of:
   forming a conductive polymer layer as the upper electrode with a solution containing a conductive polymer on a photoactive layer;
   performing post-treatment with an ionic liquid on the conductive polymer layer; and
   rinsing the post-treated conductive polymer layer,
   wherein in the step of performing post-treatment, the ionic liquid is in contact with a surface of the conductive polymer layer so that an ion exchange reaction occurs only in an upper area of the conductive polymer layer and an ion pair generated by the ion exchange reaction does not penetrate into the photoactive layer.

2. The method for manufacturing an upper electrode for a solar cell according to claim 1, wherein the photoactive layer includes a polythiophene-based polymer, a polyfluorene-based polymer, a polyaniline-based polymer, a polycarbazole-based polymer, a polyvinylcarbazole-based polymer, a polyphenylene-based polymer, a polyphenylvinylene-based polymer, a polysilane-based polymer, a polyisothianaphthanene-based polymer, a polythiazole-based polymer, a polybenzothiazole-based polymer, a polythiopheneoxide-based polymer, or a copolymer thereof.

3. The method for manufacturing an upper electrode for a solar cell according to claim 1, wherein the conductive polymer is poly(3,4-ethylenedioxythiophene):poly(styrene sulfonate) (PEDOT:PSS).

4. The method for manufacturing an upper electrode for a solar cell according to claim 1, wherein the ionic liquid contains 1-ethyl-3-methylimidazolium tetracyanoborate ([EMIM$^+$ TCB$^-$]).

5. The method for manufacturing an upper electrode for a solar cell according to claim 1, wherein the step of performing post-treatment is performed by performing a printing process.

6. The method for manufacturing an upper electrode for a solar cell according to claim 1, further comprising the step of drying the conductive polymer layer between the step of forming the conductive polymer layer and the step of performing post-treatment.

\* \* \* \* \*